United States Patent [19]

Durbin

[11] 4,081,661
[45] Mar. 28, 1978

[54] FLOW LINE COUNTER INCORPORATING PROGRAMMED REVERSAL CIRCUITRY

[76] Inventor: John R. Durbin, 2014 Green Glen Dr., Apt. 102, Kirkwood, Mo. 63122

[21] Appl. No.: 722,384

[22] Filed: Sep. 13, 1976

[51] Int. Cl.² .................... G06M 7/00; G06M 3/14
[52] U.S. Cl. .................... 235/92 EV; 235/92 PK; 235/92 PB; 235/92 R
[58] Field of Search ........ 235/92 PK, 92 EV, 92 PB, 235/92 LG, 92 V; 235/98 R, 98 A, 98 B, 98 C

[56] References Cited

U.S. PATENT DOCUMENTS

| 3,482,132 | 12/1969 | Emde | 235/92 PB |
| 3,740,532 | 6/1973 | Esch | 235/92 EV |
| 3,793,508 | 2/1974 | Maggi | 235/92 V |
| 3,811,648 | 5/1974 | Ream et al. | 235/92 V |
| 3,982,107 | 9/1976 | Butler | 235/92 V |

*Primary Examiner*—Joseph M. Thesz

[57] ABSTRACT

For counting objects moving along a line of flow in a forward or reverse direction, a system utilizes upstream and downstream sensors and a logic subsystem to provide pulse signals to a counter. The logic subsystem produces an upcount or downcount signal only after a sequence of system states is consecutively achieved. Before a count signal is produced an intervening state-confirming signal is required. When such confirming signal is followed by a count-producing signal the logic subsystem automatically resets to a reverse flow condition. Thus, neither vibrations nor reversal of object flow at any point will cause a false count.

6 Claims, 4 Drawing Figures

FLOW LINE COUNTER INCORPORATING PROGRAMMED REVERSAL CIRCUITRY

BACKGROUND OF THE INVENTION

The present invention relates to counting systems which compile a total of the number of objects which have passed a reference point on a line of flow, typically a production line, for example, a canned beverage line. Such systems utilize sensing devices responsive to objects passing the reference point.

Certain systems in current use utilize a single sensor and amplifier along with a digital up-counter. In their simplest form these systems may count falsely; they increment the count whenever an object passes in either a forward or reverse direction, and also upon vibration and other erratic motions of the items to be counted.

Systems proposed to remedy these problems have used two sensors, the first positioned a short distance upstream from the second. These systems compare the sequence of the signals from the sensors, making a determination as to the direction of flow of the objects, and may count up only when a forward direction of flow has been determined. One known system utilizes an up-down counter along with a digital clock to trigger the logic circuitry, allowing the system to count both up and down. However, since typical production lines do not always flow smoothly, false counts may result from vibrations, reversals, and other erratic motions.

SUMMARY OF THE INVENTION

The objects of the present invention include providing a flow line counting system which functions accurately at any speed of flow. Another is to avoid or compensate for false counts due to tipping, vibrating, reversing direction of flow, spinning, and other erratic motions. Further objects will be apparent from the disclosure which follows.

Generally summarizing the present invention, without limiting its scope, two sensors are positioned along a line of flow to detect the presence or absence of objects moving thereon, the second sensor located a short distance downstream from the first. Amplifiers digitalize the signals produced by the sensors. A digital logic direction of flow determination circuit determines the direction of flow and engages the system to a select up-count direction state if the upstream sensor first detects the object and to a select down-count direction state if the downstream sensor first detects the object.

In continuous forward flow, immediately following the select up-count direction state the forward direction of travel is verified by a confirm up-count direction state. Upon the upstream sensor ceasing to detect the object while the system is in the confirm up-count state, a forward count determinator circuit responds with an up-count signal. This signal is fed back to the direction of flow determination circuit, resetting the system to the select down-count direction state and terminating the signal, shaping it to a pulse.

Upon the downstream sensor also ceasing to detect the object a system transition to a neutral state occurs, produced by a direction of travel clear circuit.

Similarly, for continuous flow in the reverse direction, following the select down-count direction state a confirm down-count direction state is initiated when both sensors sense the object. Thus, upon the downstream sensor ceasing to detect the object while the system is in the confirm down-count direction state, a reverse count determinator circuit responds with a down-count signal which is fed back to the direction of flow determination circuit. The system then resets to the select up-count direction state and the down-count signal is terminated, shaping it to a pulse. On continued reverse flow, when the upstream sensor ceases to detect the object a transition to the neutral state is produced by the direction of travel clear circuit.

A digital counter circuit responds to the pulse signals from the two count determinator circuit outputs to maintain a total of the number of up-count pulses received less the number of down-count pulses received.

Under non-continuous, vibratory, or abruptly reversing flow conditions, the system insulates the counter from responding to small vibrations by automatically reversing to the opposite directon select state immediately after a count pulse is produced, and then requiring the succession of states set forth above. Should there be large in-line reversals of flow, the system will accurately decrement and increment the count as these successions of steps are carried out.

DESCRIPTION OF THE PREFERRED EMBODIMENT

Figure 1:
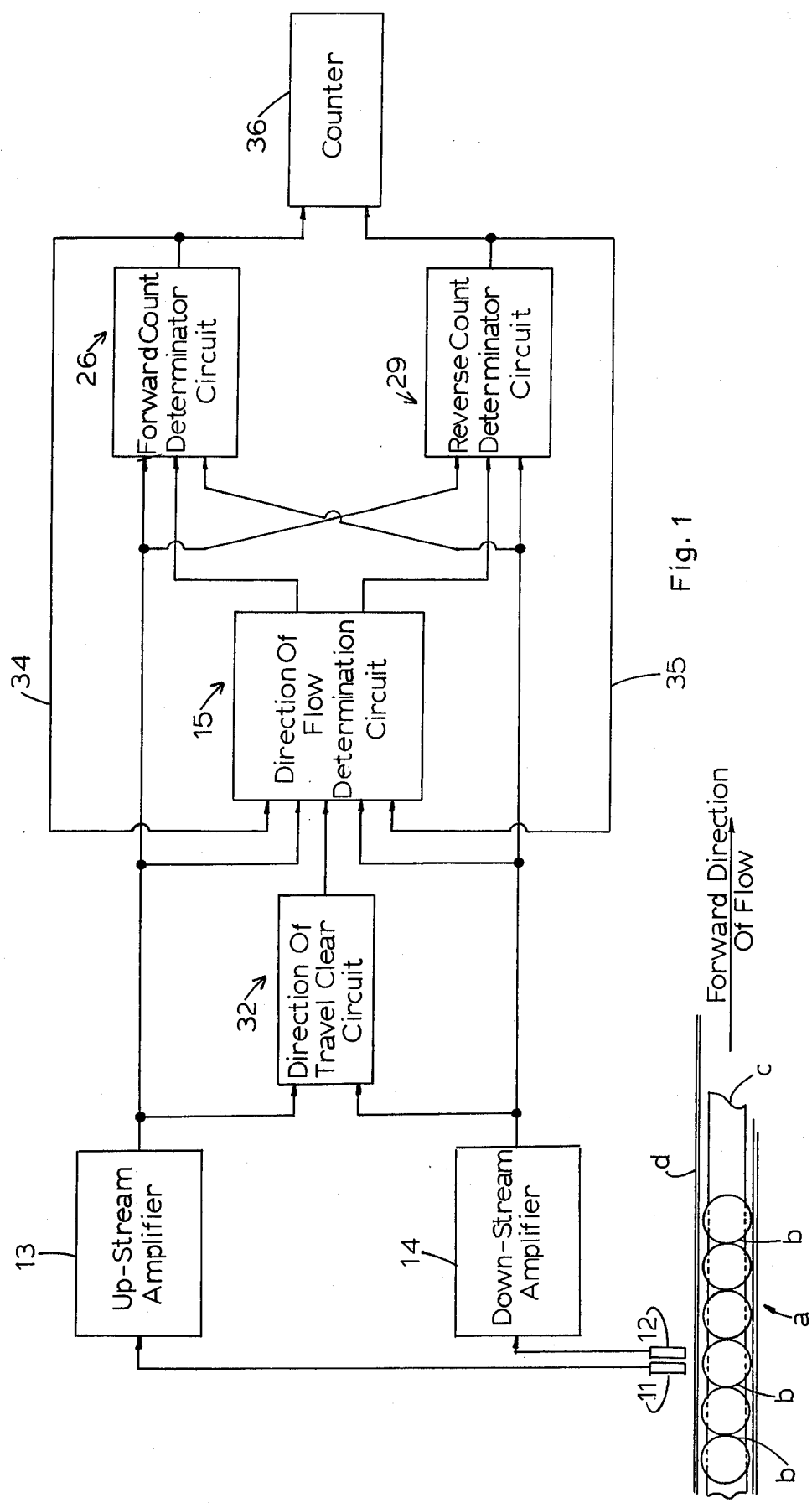
FIG. 1 is a block diagram of a system for counting objects moving along a line of flow embodying the present invention.
Figures 2, 3:
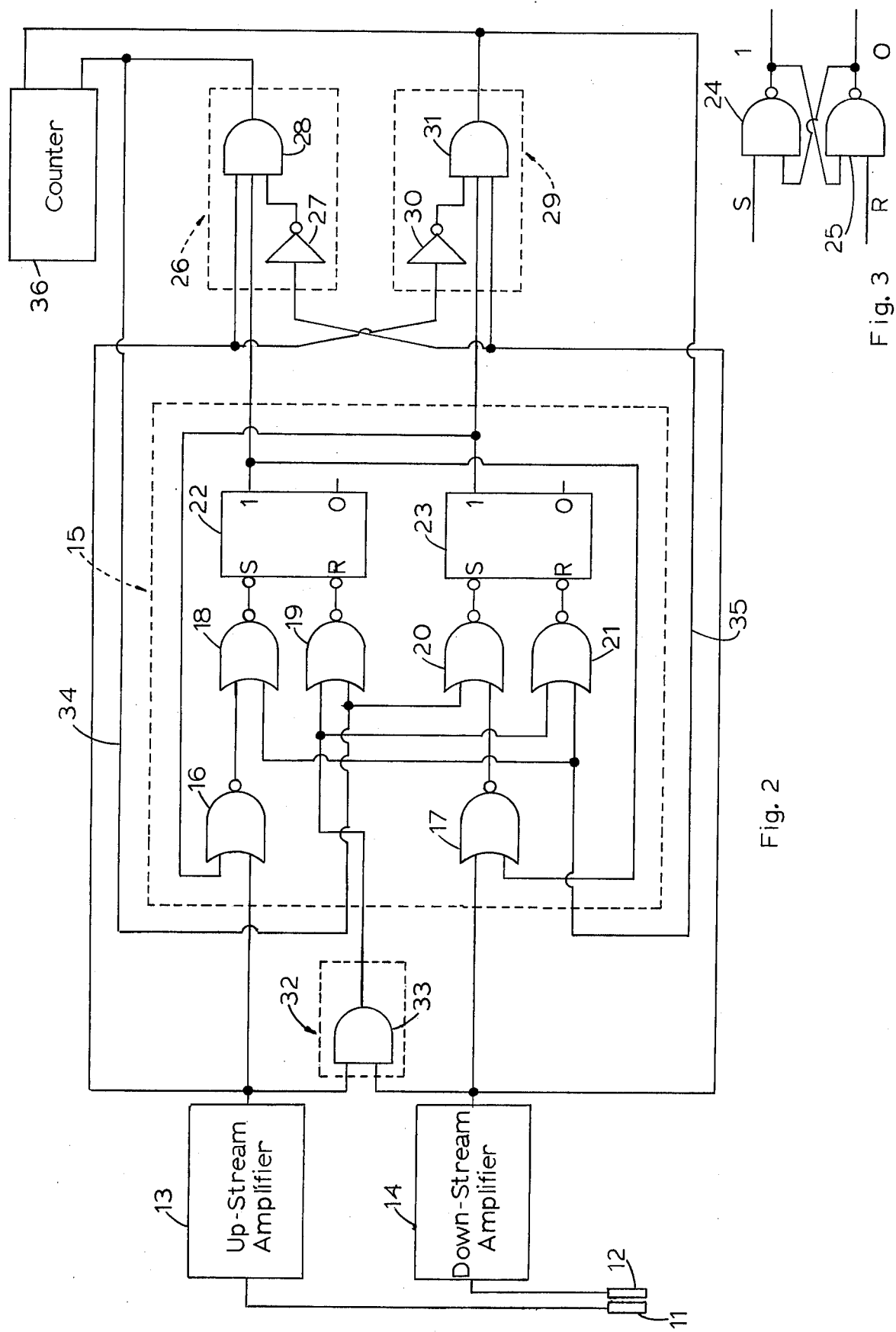
FIG. 2 is a circuit diagram showing a preferred embodiment of the system described in FIG. 1.
FIG. 3 is a detailed diagram of a flip-flop circuit utilized in FIG. 2.

A preferred embodiment of the present invention is shown in block diagram form in FIG. 1 and circuit form in FIG. 2.

As illustrated in FIG. 1, the circuit described below is used to accurately count objects $b$ moving along a line of flow, generally designated $a$, typically a production line. The objects $b$ are carried along the line of flow $a$ by a conveyer $c$ having guide rails $d$. The normal direction of flow of the objects $b$ for forward flow is in the direction of the arrow, but may be subject to reversals, vibrations, and other erratic motions.

The embodiment utilizes two sensors 11, 12 positioned alongside and perpendicular to the line of flow $a$. The sensors 11, 12 used in the preferred embodiment are of the type which detect the presence of metal objects passing near their ends. Alternatively, other types of sensors may be used, including light-sensitive sensors and sensors for which the objects $b$ physically engage a switch. The two sensors 11, 12 are located a short distance apart along the line of flow $a$. That sensor located at the point which the objects will reach first when moving in a forward direction along the line of flow $a$ is designated the upstream sensor 11 and the other sensor is referred to as the downstream sensor 12. Their sensitivity and response must be such that neither can sense two successive objects simultaneously. The spacing between the sensors 11, 12 is important and is dependent upon the size and shape of the objects $b$ to be sensed. The two sensors 11, 12 must be positioned at such a spacing along the line of flow $a$ that, taking into account their sensitivity, they cannot change their signals simultaneously; the spacing must be sufficiently short such that the two of them cannot sense different objects simultaneously but they must be capable of simultaneously sensing the same object.

The output from each sensor 11, 12 is connected to the input of an amplifier 13, 14 which is used to digitalize their respective signals to levels required by the logic subsystem. Therefore, the output of the amplifiers 13, 14 takes the form of only two possible voltages, a voltage substantially zero volts commonly called "digital low" or "0" and an output of a higher voltage, commonly called "digital high" or "1." For purposes of this embodiment the amplifier output "digital low" is designated digital "sense on." The amplifier associated with the upstream sensor 11 is designated the upstream amplifier 13, and the amplifier associated with the downstream sensor 12 is designated the downstream amplifier 14.

The preferred embodiment includes a logic subsystem having a direction of flow determination circuit, generally designated 15, having five inputs and two outputs. This circuit 15 determines the direction of flow of the objects moving on the line of flow $a$ from signals received at its input from the amplifiers 13, 14, stores this information, and at its outputs signals this information to circuit elements which will be described later. Included in the circuit are six two-input NOR gates 16, 21, common to digital circuitry. The output of each NOR gate is always a digital "low" unless both inputs are digital "low"; then the output is a digital "high". The circuit 15 also has two set-rest flip-flops 22, 23 conventionally made with two cross-coupled NAND gates 24, 25, as illustrated in FIG. 3. Each flip-flop 22, 23 has an "S" input and an "R" input, a "1" output and a "0" output. When the "S" input is "high" and the "R" input is "low," the "1" output is "low" and the "0" output is "high". Conversely, the "S" input is "low" and the "R" input is "high," the "1" output is "high" and the "0" output is "low." Upon a transition to the state in which both inputs are "high," the outputs, which are latched by cross-coupling as shown in FIG. 3, remain as they were in the preceding state. This allows the flip-flops 22, 23 to serve as simple memory devices.

Internal connections for the direction of flow determination circuit 15 are as follows:

The output of NOR gate 18 is connected to the "S" input of the first flip-flop 22 and the output of NOR gate 19 is connected to the "R" input of the first flip-flop 22. The output of NOR gate 20 is connected to the "S" input of the second flip-flop 23 and the output of NOR gate 21 is connected to the "R" input of the second flip-flop 23. One input of NOR gate 18 is connected to the output of the NOR gate 16. The output of NOR gate 17 is connected to one input of NOR gate 20. The other input of NOR gate 20 and an input of NOR gate 19 together form a first feedback input for the direction of flow determination circuit 15. The remaining input from NOR gate 18 and an input from NOR gate 21 together form a second feedback input for the circuit. The remaining input to NOR gate 21 and the remaining input to NOR gate 19 together form an input to the circuit 15 which is connected to the output of a direction of travel clear circuit 32, to be described later. One input to NOR gate 16 forms an input to the circuit which is connected to the output of the upstream amplifier 13, and its remaining input is connected to the "1" output of the second flip-flop 23. One input of NOR gate 17 is connected to the "1" output of the first flip-flop 22, and its remaining input forms that input of the direction of flow determination circuit 15 which is connected to the output of downstream amplifier 14.

Responsive in part to the direction of flow determination circuit 15 is a forward count determinator circuit generally designated 26 consisting of a three-input digital logic AND gate 28 with a logic inverter gate 27 on one input, forming an inverted input thereat. The other two inputs to the AND gate 28 form the two non-inverted inputs to the circuit 26. One of the non-inverted inputs is connected to the output of the upstream amplifier 13, and the other is connected to the output of the direction of flow determination circuit 15, whose output is the "1" output of the first flip-flop 22. The inverted input of the forward count determinator circuit 26 is connected to the output of the downstream amplifier 14. The conventional AND gate 28 functions so that its output is "low" except when all three inputs are "high"; then the output is "high." The inverter 17 produces a "low" signal at its output for a "high" signal at its input, and a "high" signal at its output for a "low" signal at its input. The output of AND gate 28 forms the output of the forward count determinator circuit 26.

A reverse count determinator circuit generally designated 29 is similar to the forward count determinator circuit 26. It has a three-input AND gate 31 with an inverter gate 30 on one input. This inverted input is connected to the output of upstream amplifier 13. One of its remaining inputs is connected to the output of the direction of flow determination circuit 15 formed by the "1" output of the second flip-flop 23 and its last input is connected to the output of the downstream amplifier 14. The output of AND gate 31 forms the output of the reverse count determinator circuit 29.

From the output of the forward count determinator circuit 26 a feedback connection 34 is coupled to the feedback input of the direction of flow determination circuit 15. Likewise, there is feedback connector 35 from the output of the reverse count determinator circuit 29 to the second feedback input of the direction of flow determination circuit 15.

To the last remaining input of the direction of flow determination circuit 15 is connected a direction of travel clear circuit generally designated 32, consisting simply of an AND gate 33 with one input connected to the output of the upstream amplifier 13 and the other to the output of the downstream amplifier 14.

The outputs of the forward count determinator circuit 26 and the reverse count determinator circuit 29 serve as inputs to a digital counter subsystem 36 which records the total number of up-count pulses produced by the forward count determinator circuit 26 less the total number of down-count pulses produced by the reverse count determinator circuit 29. This embodiment contemplates use of an up-down counter capable of incrementing and decrementing the count on receipt of the appropriate signal. Alternatively, the circut would function properly using only a digital upcounter along with a memory register to store the down-count pulses and disable the up-counter during that number of subsequent up-count pulses corresponding to the number of down-count pulses stored. Such use of a counter limited to up-counting permits introduction of circuitry for determining rate of flow of the objects $b$.

Figure 4:
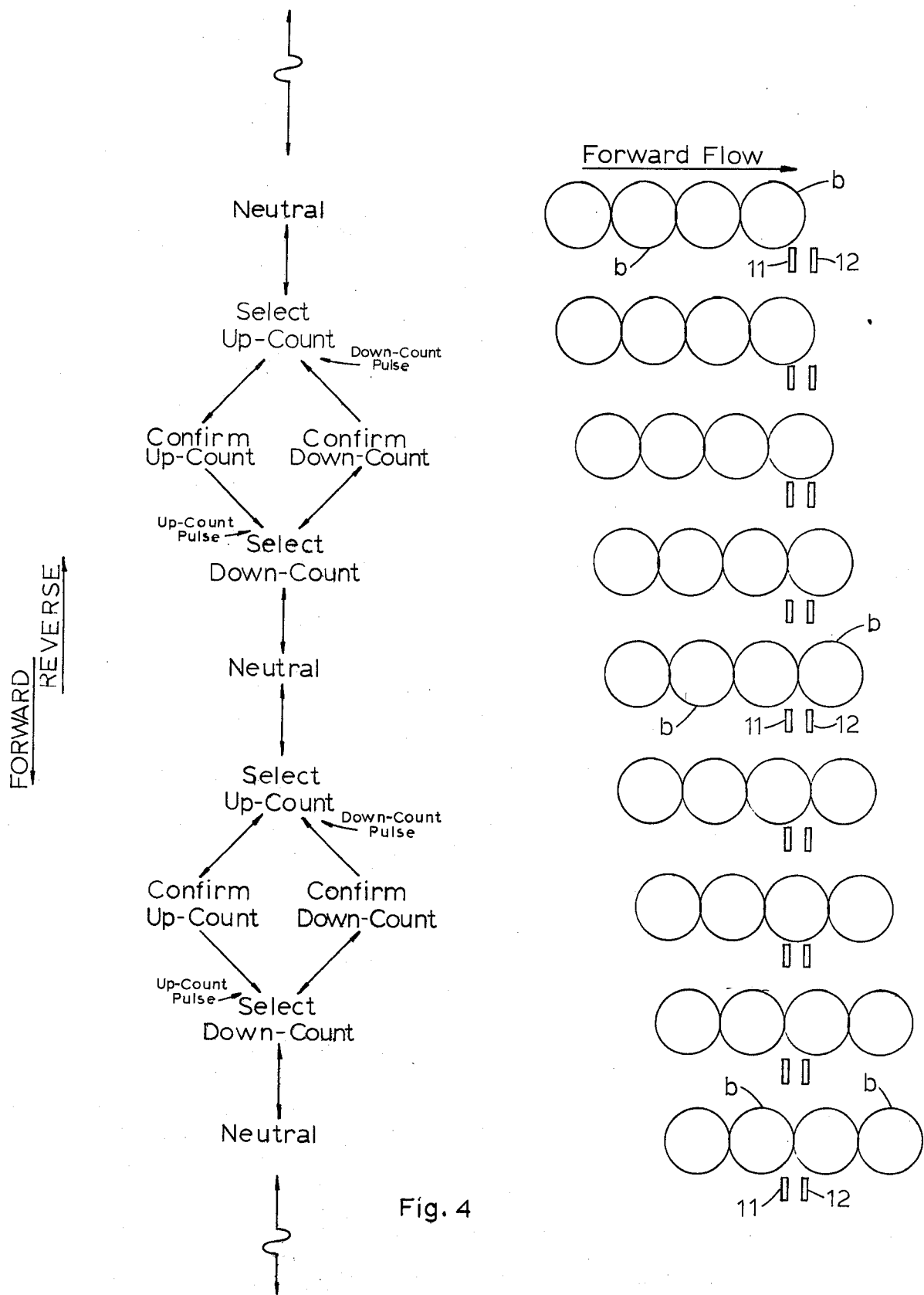
FIG. 4 is a flow diagram relating the changes of state of the circuit to the changes of position of the objects on the flow line. Arrows indicate state transitions permitted by the system.

Operation of the present system is illustrated by the flow diagram of FIG. 4. Each of the amplifiers 13, 14 produces a "high" output when its sensor 11, 12 does not detect the presence of an object b, and a "low" signal when it detects the presence of an object b, designated digital "sense on". With no objects b being detected by either sensor 11, 12 the system inputs are both "high." This is the neutral state.

Upon forward movement of the objects, the upstream sensor 11 first detects an object b and the upstream amplifier 13 produces a "low" signal. This transition causes the output of the direction of travel clear circuit 32 to become "low" and the output of NOR gate 16 to become "high," because the output of the second flip-flop 23 is also "low." Thus, both inputs to NOR gate 19 are "low," producing at its output a "high." Therefore the first flip-flop 22 has the proper inputs to produce a "high" at its "1" output and therefore a "high" to one of the non-inverted inputs of the forward count determinator circuit 26. The presence of the "high" at the input of NOR gate 17 from the output of the first flip-flop 22 assures a "low" at the output of the NOR gate 17 should the output of downstream amplifier 14 become "low." Therefore the inputs of NOR gate 20 are both "low," since the output of the forwrd count determinator circuit 26 is "low," causing the output of the NOR gate 20 to be "high," producing no change at the "1" output of the second flip-flop 23, leaving it "low." Thus the possibility of the reverse direction of flow determination is locked out. This state is designated the select up-count direction state.

Upon continuous forward flow the downstream sensor next begins to detect the object and the output of the downstream amplifier 14 becomes "low." Since the reverse direction determination is locked out, there is no signal change in the direction of travel flow determination circuit 15. Its signal is received by the inverted input of the forward count determinator 26 whose AND gate 28 is now receiving two "high" inputs. The system now is in the confirm up-count state.

Upon the upstream sensor ceasing to detect the object, the upstream amplifier 13 produces a "high" which is received by the remaining input of AND gate 28 of the forward count determinator 26. AND gate 28 then produces a "high" output; the counter 36 uses this signal to produce an increment of one and the signal is also fed back through the first feedback connector 34 to the direction of travel flow determination circuit 15. Also, that input of NOR gate 16 from the upstream amplifier 13 is forced "high," causing its output to become "low." Since the output of AND gate 31 is "low," both inputs to NOR gate 18 are "low," forcing its output "high." That input of NOR gate 19 from the first feedback connector 34 is now "high," causing its output to be "low." Thus, the "S" input of flip-flop 22 is "high" while its "R" input is "low," causing its "1" output to be "low." Similarly, that input of NOR gate 20 from the first feedback connector 34 is "high," forcing its output "low," and the "S" input of the first flip-flop 23 "low." The output of the second flip-flop 23 thus goes "high," since its "R" input has remained unchanged at "high." Thus that input of NOR gate 16 connected to the "1" output of the second flip-flop 23 goes "high," assuring its output will be "low." Since the output of AND gate 31 is "low," the output of NOR gate 18 and the "S" input of the first flip-flop 22 are "high," the output of NOR gate 19 remains "low," keeping the "R" input of the first flip-flop 22 "low." Thus the "1" output of the first flip-flop 22 is "low." Note that the condition of the flip-flops is now reversed. When the "1" output of the first flip-flop 22 goes "low," the output of AND gate 28 goes low, shaping the signal to the counter 36 to a pulse. Consequently, that input of NOR gate 19 from the first feedback connector 34 is "low." Since the output of the AND gate 33 is "low," the output of NOR gate 19 is "high," making the "R" input of the first flip-flop 22 "high," but producing no change at the output of the first flip-flop 22. There is likewise no change in the output of NOR gate 20, even though its input from feedback connector 34 goes "low," since the output of NOR gate 17 becomes "high" after the "1" output of flip-flop 22 becomes "low.".

Upon the downstream sensor 12 also ceasing to detect the object, the downstream amplifier 14 produces a "high," and AND gate 33 produces a "high," causing the "1" output of the second flip flop 23 to also become low. The system has returned to the neutral state.

Upon continuous flow in a reverse direction, the sequence of states are in effect a mirror image of the forward flow continuous sequence. Proceeding from the neutral, a confirm down-count state is initiable only after the select down-count direction state. The detailed circuit transitions will, from the foregoing disclosure, be apparent to those skilled in the art.

The principal advantages of the present invention are reaped, however, when the flow is subject to abrupt reversals, vibrations and other discontinuities, including those caused by noise from the amplifiers 13, 14. Because of the automatic reversal of the indication of flow direction when a count pulse has been started, a subsequent reversal of flow direction, or even a vibration which causes a sensor to momentarily cease to detect the object, will not cause the system to immediately count again; the system must pass through a confirm direction state before another count could occur. Since the direction of flow determination circuit 15 is automatically reversed after a count, any subsequent count of the same object will be an opposite count, thereby assuring that an object that has passed the sensors more than once will nevertheless increase the count total by only one.

An illustration describing the relationship between object movement and state transitions is found on the flow diagram of FIG. 4. The progression of objects b (such as cans on a production line) relative to the sensors 11, 12, as shown at the right side of FIG. 4, bring about the state transitions shown at the left side, in any order designated by the arrows. The system is not confined to continuous motion in one direction, and responds to erratic motions, passing from one state to a succeeding state where designated by the arrows. While the preferred embodiment so described mentions sensors which detect proximity of metal (as for can lines) and light sensors, other types of sensing mechanisms may be employed for use with the present invention. Such alternative devices might even utilize a single receiving sensor monitoring two signal sources, each emitting a signal distinguishable from the other, the two sources being similarly spaced apart along the production flow line. Audio, video, or electromagnetic signals whose distinguishable characteristic was frequency or phase might be utilized. Double-ended arrows indicate state transitions which are not immediately directly reversible. For example, should there be a reversal of movement after a transition from confirm down-count to select up-count, the system will pass to the confirm up-count state; it being impossible for it to revert directly to the confirm down-count state. Irreversible state transitions only occur for those transitions producing a count pulse, such as the transition from the confirm up-count state to the select down-count state. State transitions other than those designated by the arrows are precluded by design. The terms upstream and downstream sensor means, as used in the claims, are to be deemed broad enough to encompass such a two-source signal emitting and sensing mechanism.

From this disclosure, other variations in apparatus and details of its use will become apparent to persons skilled in the art.

I claim:

1. A system for counting similar-sized objects moving along a line of flow without counting the vibrations of such objects, comprising
   upstream sensor means to detect either the presence or absence of an object as it passes along the line of flow, and means operably associated therewith to produce signals reflecting such presence or absence,
   a downstream sensor similar to said upstream sensor and similar signal producing means associated therewith,
   said sensors being positioned along a line of flow at a spacing relative to the size of such moving objects sufficiently short that said two sensors may simultaneously sense the same object and cannot simultaneously sense different objects, and great enough such that the upstream sensor and the downstream sensor cannot change their signals simultaneously,
   a logic subsystem having the inputs responsive to signals from the upstream sensor and the downstream sensor, said logic subsystem including means to provide consecutively during uninterrupted vibration-free flow along such production lines:
   a neutral state in which both sensors do not detect an object and by which any previously established directional state is neutralized,
   a select up-count direction state reflecting the condition that the upstream sensor detects an object and the downstream sensor does not,
   a confirm up-count direction state, initiable only immediately following the select up-count direction state, reflecting the conditon that both sensors detect an object, and
   a select down-count direction state reflecting the condition that the downstream sensor detects an object and the upstream sensor does not;
   said logic subsystem further having means for producing a count-up output signal attendant to the state change from said confirm up-count direction state to said select down-count direction state,
   whereafter, on continued forward uninterrupted vibration-free flow, the neutral state again follows said select down-count direction state,
   said logic subsystem further having means to provide a confirm down-count direction state initiable only immediately following the select down-count direction state, reflecting the condition that both sensors detect an object,
   said logic subsystem further having means for producing a count-down output signal when said logic subsystem state changes from said confirm down-count direction state to said select up-count direction state,
   said logic subsystem operating in the following sequence upon a reverse direction flow along the line of flow: said neutral state, said select down-count direction state, said confirm down-count direction state, said select up-count direction state, finally returning to said neutral state,
   whereby, the logic subsystem corrects the count for large movements opposite to the normal direction of flow and permits count of reversed flow,
   counter means, and
   means for incrementing the count of the counter means upon reception of a count-up output signal from the logic subsystem and means for decrementing such count upon reception of a count-down output signal therefrom.

2. A digital logic system for counting objects moving along a line of flow in a forward or reverse direction without counting the vibrations of such objects, comprising
   upstream sensor means to detect either the absence or presence of an object at it passes along the line of flow, and upstream amplifier means operably associated thewith to produce a digital "sense on" signal,
   downstream sensor means similar to said upstream sensor and similar downstream amplifier means associated therewith to produce a digital "sense on" signal,
   said sensors being positioned along a line of flow at a spacing, relative to the size of such objects moving thereon, great enough that the two sensors cannot change their signals simultaneously and sufficiently short that said two sensors cannot simultaneously sense two adjacent objects and may simultaneously sense the same object thereon,
   a digital logic direction of flow determination circuit having inputs connected to said upstream amplifier means and said downstream amplifier means, whereby to determine and signal the direction of flow of the objects,
   a digital logic forward count determinator circuit having three inputs which receive signals from said upstream amplifier means, from said downstream amplifier means, and from said direction of flow determination circuit, said forward count determinator circuit responding with a count-up signal at its output upon reception of the combination of a "sense on" signal from said downstream amplifier means, a signal indicating forward direction of object flow from said direction of flow determination circuit, and the absence of a "sense on" signal from said upstream amplifier means,
   a digital logic reverse count determinator circuit having three inputs which receive signals from said upstream amplifier means, from said downstream amplifier means, and from said direction of flow determination circuit, said reverse count determinator circuit responding with a count-down signal at its output upon reception of the combination of a "sense on" signal from said upstream amplifier means, a signal indicating reverse direction of object flow from said direction of flow determination circuit, and the absence of a "sense on" signal from said downstream amplifier means,
   said directon of flow determination circuit having means, effective on first determining direction of flow, to enable and activate one of said count determinator circuits and lock out the other,
   feedback means, connected from the output of said forward count determinator circuit to an input of said direction of flow determination circt, to enable and activate the reverse count determinator circuit and deactivate and disable the forward count determinator circuit and thereby terminate the signal therefrom, said direction of flow determination circuit having means to respond to said count-up signal by resetting its output connected to the input of said forward count determinator circuit indicating direction of flow not forward, and its output connected to the input of said reverse count determinator circuit indicating reverse direction of flow, feedback means, connected from the output of said reverse count determinator circuit to an input of said direction of flow determination circuit, to enable and activate the forward count determinator circuit and deactivate and disable the reverse count determinator circuit and thereby terminate the signal therefrom, said direction of flow determination circuit having means to respond to said reverse count determinator signal by resetting its output to the input of said reverse count determinator cirlcuit indicating direction of flow not reverse, and its output to the input of said forward count determinator circuit indicating forward direction of object flow, a digital logic direction of travel clear circuit having connected to its two inputs the outputs of the two said amplifier means, having means to respond at its output with a signal indicating to an input of said direction of flow determination circuit that the direction of flow is neither forward nor reverse, upon the absence of a "sense on" signal from both said amplifier means, and counter means responsive to said up-count signals and such down-count signals to actively record the number of up-count pulses less the number of down-count pulses, whereby such digital logic system functions to count objects flowing in both forward and reverse directions, to permit small vibrations of such objects without counting, and to correct the count for large movements of such objects opposite to the normal direction of flow.

3. A digital logic system as defined in claim 2, wherein
said counter means has means to increment the count by one upon reception of an up-count pulse signal and decrement the count by one upon reception of a down-count pulse signal.

4. A digital logic system as defined in claim 2, wherein
said counter means includes an electrical digital counter, which functions to increment the count by one upon reception of an up-count pulse signal, and wherein
said counter means includes memory register means for temporarily storing down-count pulses and disabling said upcounter means during one subsequent up-count pulse signal for each such down-count pulse so temporarily stored.

5. A digital logic system as defined in claim 4, together with
rate determination means operably associated with said counter means.

6. A digital logic system as defined in claim 2, wherein
each said digital logic count determinator circuit includes an electrical digital three-input logic gate of the type which responds with a digital output response when all inputs simultaneously have a digital "high" signal, and
each said digital logic count determinator circuit includes an electrical digital logic inverter gate forming an inverted input for one input of said three-input logic gates.

* * * * *